United States Patent [19]
Gould et al.

[11] Patent Number: 5,021,221
[45] Date of Patent: Jun. 4, 1991

[54] APPARATUS FOR PRODUCING HIGH PURITY SILICON FROM FLAMES OF SODIUM AND SILICON TETRACHLORIDE

[75] Inventors: Robert K. Gould, E. Windsor; Charles R. Dickson, Princeton, both of N.J.

[73] Assignee: Aero Chem Research Lab., Inc., Princeton, N.J.

[21] Appl. No.: 938,049

[22] Filed: Dec. 4, 1986

Related U.S. Application Data

[60] Division of Ser. No. 680,923, Dec. 12, 1984, abandoned, which is a continuation of Ser. No. 368,460, Apr. 14, 1982, abandoned, which is a continuation of Ser. No. 249,396, Mar. 31, 1981, abandoned, which is a continuation of Ser. No. 199,100, Oct. 20, 1980, abandoned.

[51] Int. Cl.[5] .................. B01J 14/00; C01B 33/02
[52] U.S. Cl. .................... 422/129; 422/198; 423/348; 423/349; 423/350; 239/505; 239/520
[58] Field of Search ............... 422/129, 198; 423/348–350; 239/505, 507, 509, 512, 520

[56] References Cited

U.S. PATENT DOCUMENTS

| 3,084,874 | 4/1963 | Jones et al. | 239/424 |
| 3,497,141 | 2/1970 | Rydberg | 239/512 |
| 3,957,465 | 5/1976 | Pircon | 55/90 |
| 4,027,053 | 5/1977 | Lesk | 423/348 |
| 4,102,765 | 7/1978 | Fey et al. | 423/348 |

FOREIGN PATENT DOCUMENTS 741630 12/1955 United Kingdom .

OTHER PUBLICATIONS

Olson et al., Silicon Halaide–Alkali Metal Flames as a Source of Solar Grade Silicone, DOE/JPL 954777 79/7.

*Primary Examiner*—Robert J. Warden
*Assistant Examiner*—Lyle Alfandary Alexander
*Attorney, Agent, or Firm*—Louis E. Marn

[57] ABSTRACT

Vaporized silicon halide is mixed with a vaporized alkali metala in a reactor chamber in an exothermic reaction producing liquid silicon droplets and gaseous alkali metal halide, and then passed out of the reactor chamber through a nozzle in a supersonic jet. The supersonic jet is produced by utilizing vacuum means to maintain the exit chamber at a lower pressure than the reactor chamber. Separation of the silicon from the salt by-products is performed by shock wave impaction separation technique wherein the products of the complete reaction between the alkali metal and silicon halide are made to impinge upon an unrestricted, flat surface so that the direction of flow of the gas changes abruptly and a shock zone is created above the flat surface. The silicon droplets are carried by their large forward momentum through the shock zone onto the separating surface where they are deposited. The gaseous alkali metal halide flows across the surface and is thus separated from the silicon product. The silicon droplets are removed in a variety of physical configurations to produce silicon in pellet form, sheet form, ingot form, or single crystal silicon.

15 Claims, 6 Drawing Sheets

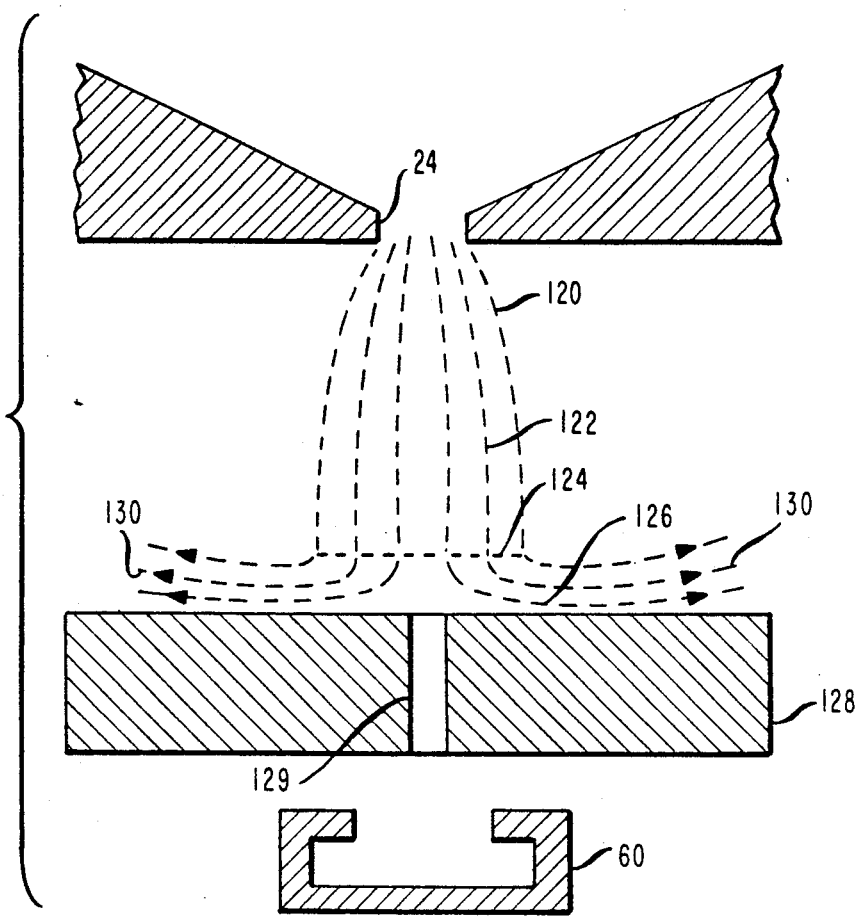
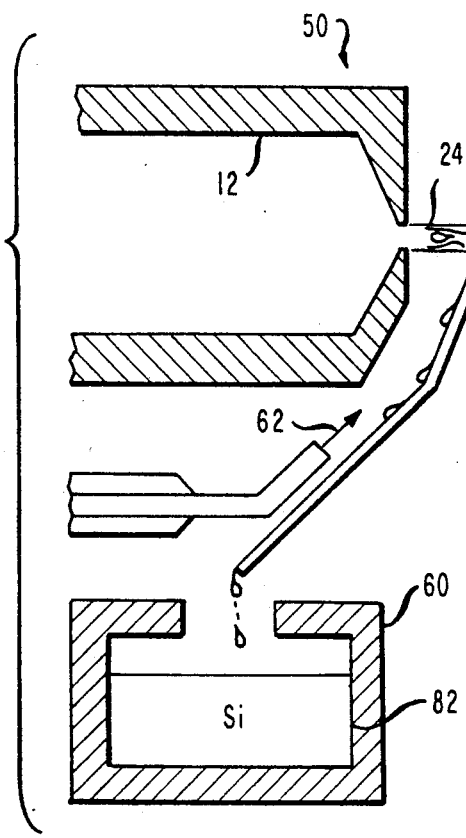
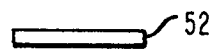

APPARATUS FOR PRODUCING HIGH PURITY SILICON FROM FLAMES OF SODIUM AND SILICON TETRACHLORIDE

This application is a division of application Ser. No. 06/680,923, filed Dec. 12, 1984, now abandoned which is a continuation of Ser. No. 06/368,460, filed on Apr. 14, 1982, now abandoned which is a continuation of Ser. No. 06/249,396, filed on Mar. 31, 1981, now abandoned which is a continuation of Ser. No. 06/199,100, filed on Oct. 20, 1980, now abandoned all entitled "Method and Apparatus for Producing High Purity Silicon from Flames of Sodium and Silicon Tetrachloride".

FIELD OF THE INVENTION

This invention relates to a process for producing high purity silicon from a flame of silicon halide and alkali metal and separating the liquid silicon from the gaseous sodium halide by-product in an efficient and contamination free manner.

DESCRIPTION OF THE PRIOR ART

The need for high quality silicon is accelerating because of its indispensable use in semiconductors and for solar energy cells. A number of processes are used commercially and substantial research work has been conducted on developing improved processes. The need has been so critical that for a number of years the Department of Energy has supported an extensive program to develop new processes to produce polycrystalline silicon at a low cost.

The preparation of single and poly crystalline silicon by techniques involving the reaction of silicon tetrachloride with a metal reductant such as sodium are known in the art. U.S. Pat. No. 4,102,767 to Mazelsky et al. discloses the preparation of single crystals of silicon from a poly crystalline sheet or mass formed from the reaction of silicon tetrachloride and sodium in an arc furnace. U.S. Pat. No. 4,102,765 to Fey et al. similarly discloses the preparation of high purity silicon by tangentially projecting a silicon halide and an alkali metal into a reaction chamber after the aforementioned reactants have been injected into an electric arc heater. The projection of the reaction mixtures causes the silicon to separate from the metal halide slat, after which the silicon is deposited on a downwardly extending surface to permit it to flow into an associated receptacle. The Fey et al. patent relies on centrifugal force for the separation of the salt from the purified silicon and is ineffective from a commercial standpoint. Although this reaction has material advantages from an energy saving standpoint, the process has not been successful commercially because of the extreme difficulty in separating the fine particles of silicon produced from the salt by-product. Such problems were considered insurmountable, since known testing for separating fine particles has proven unsuccessful.

A description of the large effort which has been directed toward the use of sodium/silicon tetrachloride flames as a source of pure silicon appears in "Development of a Process for High Capacity Arc Heater Production of Silicon for Solar Arrays", M. G. Fey of Westinghouse Electric Corp., Quaterly Report, ERDA/JPL 05489-7712, April–June, 1977.

The present inventors had attempted to learn if the sodium/silicon tetrachloride reaction could be controlled so as to produce inexpensive high purity silicon. Some of the initial experimental and theoretical results were reported in "Silicon Halide-Alkali Metal Flames as a Source of Solar Grade Silicon" by D. B. Olson and R. K. Gould dated April, 1979 and identified as Ser. No. DOE/JPL 954777-79/7 (distribution category: UC-63). Extensive efforts with this process failed to produce better than a mixture of 20% silicon and 80% sodium chloride salt by weight. This work is further reported in "Silicon Halide-Alkali Metal Flames as a Source of Solar Grade Silicon" by D. H. Olson, W. J. Miller and R. K. Gould dated January, 1980 and identified as Ser. No. DOE/JPL 954777-80/8 (Distribution Category: UC-63). Also of interest is the U.S. Department of Energy report entitled "Development of a Model and Computer Code to Describe Solar Grade Silicon Production Processes" by R. Srivastava and R. K. Gould dated May, 1979, Ser. No. DOE/JPL 954862-6 which relates to a theoretical model.

SUMMARY OF THE INVENTION

It is a principal object of the present invention to provide a process for separating high purity silicon from the reaction products of silicon halide and alkali metal.

It is another object of the invention to provide such a process which is also a purification process.

It is a further object of the present invention to provide a process as aforesaid which operates in an efficient manner at reduced energy expenditures.

It is a still further object of the present invention to provide a process as aforesaid which facilitates the collection of the purified silicon product in a variety of forms, such as pellets, single crystals, sheets and ingots.

Other objects and the advantages of the invention will become apparent to those skilled in the art from a review of the ensuing description.

In accordance with the present invention, a process for producing purified silicon has been discovered, which utilizes the vaporizing of a silicon halide, such as silicon tetrachloride or silicon trichloride, and an appropriate reducing metal such as sodium or potassium. The two vaporized materials are mixed in a reaction chamber to form the reaction products of gaseous sodium chloride and liquid silicon. The liquid silicon is in the form of very small droplets or particles. The reaction takes place at a temperature exceeding the melting point of silicon and, at pressures which may range up to about one atmosphere (absolute). Under these moderate pressures, the silicon liquifies, while the sodium salt remains in the gaseous state.

The liquid silicon and sodium salt are released from the reaction chamber through a small hole, nozzle or slot into a separation chamber maintained at a pressure of less than one half that of the reactor by vacuum means so that the reaction products form a supersonic jet exiting from the reaction chamber. The supersonic jet is then caused to impinge upon an unconfined, substantially flat separating surface whereon the silicon droplets in the jet deposit. It is essential to the invention that a shock barrier be maintained above the flat separating surface. It is believed that in the prior art process which utilized a crucible, the side of the crucible interrupted the full formation of the shock wave, thereby interfering with the separation. Although it is preferred to utilize a flat, unrestricted plate for the separation it has been found that a crucible or other surface can be utilized if the height of the sides does not exceed a number calculated by using the following equation:

$$L < \frac{W - D_E - 2(d/F)}{2(0.35 + (1/F))}$$

wherein L is the height of the side of the crucible, d is the distance from the jet nozzle exit to the top of the collector crucible, $D_E$ is the expanded jet diameter immediately after it leaves the nozzle and is related to the nozzle throat diameter $D_N$ by the formula:

$$D_E = \frac{D_N}{M^{\frac{1}{2}}} \left(\frac{2}{\gamma+1}\right)^{\frac{\gamma+1}{4(\gamma-1)}} \left(\frac{P_T}{P_0}\right)^{\frac{\gamma+1}{4\gamma}}$$

wherein $P_1/P_0$ is the nozzle pressure ratio, $\gamma$ is the ratio of specific heats and the Mach number M is given by $$M = \sqrt{\frac{2}{\gamma-1}\left[\left(\frac{P_T}{P_0}\right)^{\frac{\gamma-1}{\gamma}} - 1\right]}$$

The quantity F is $F = 0.22 + 5.22M^{0.9}$

It is believed that the presence of the sides of any appreciable height cause formation of shock waves substantially parallel to the sides which disrupt the main shock wave above the collector. It is also preferable that the temperature of the flat separating surface be maintained at approximately the melting point of silicon. The salt vapors are then drawn off by the action of an appropriate pumping means, or by the circulation of a sweeper gas medium. One of the advantages of this procedure is that theoretically a much purer product can be obtained since along with the separation of the sodium chloride the salt evaporants would be removed such as boron chloride and phosphorus chloride.

The reactor used in the present invention comprises a chamber having reactant inlet ports for the injection of the gaseous reactants, and electrical heating means for raising and maintaining the temperature of said reactor within the desired range. Heat from the preheating means is required only at the start-up phase of the process and not after the process has been initiated. The reactor includes an exit port or nozzle means of a size effective to promote the formation of the supersonic jet of liquid silicon and gaseous salt.

The apparatus also includes a vacuum chamber into which the jet discharges. It is essential to the invention that the pressure in the vacuum chamber is maintained at a sufficiently low pressure to cause the gases to discharge and strike the separating surface at a supersonic speed. Only a small pump is required because the products are both solids. The apparatus further includes a separator means which comprises a heated flat surface against which the supersonic jet of the liquid silicon impinges. The separator means is maintained in the vacuum chamber.

The process of the present invention is adapted for operation with the apparatus in either the vertical or horizontal position. In one embodiment, the apparatus may be disposed so that the supersonic jet containing liquid silicon droplets is forced to flow in the horizontal direction against the flat separator causing the droplets to condense to the liquid phase. In this embodiment, the separated liquid silicon flows downward, aided by the force of gravity, and is collected in an appropriate collection means, while the salt by-product, in the gaseous form, flows upward and away from the point of impaction on the surface of the separator means and is subsequently condensed. In a yet further embodiment, the reactor means may define a plurality of nozzle means, in the instance where the reactor is of sufficient size, to facilitate commercial scale production of purified silicon. Alternatively the nozzle means may comprise an elongated slot or a plurality of slots.

The process of the invention not only permits an expensive high purity silicon to be produced, but also allows for the silicon to be collected in a variety of convenient forms, including pellets, single crystals, sheets and ingots.

The reason for the effectiveness of the process is not understood. It is theorized that as the jet discharges from the reactor vessel into a chamber maintained at reduced pressure, the salt is in a gaseous form and the silicon is in the form of liquid droplets. In the reactor vessel the temperature of the reaction would be at say 2300 K. As the products pass through the nozzle into the reduced pressure area the temperature of the jet is reduced, as an illustration, to about 1800 K and the velocity of the jet is accelerated to about 100 m s$^{-1}$ at a pressure of 0.02 atm in the vacuum chamber. The supersonic jet of gaseous sodium chloride (salt) and liquid droplets of silicon approach the flat impact plate and passes into a shock zone formed by the supersonic gas velocity. The large mass of gas is materially slowed in speed in relation to the fine silicon droplets as they pass through the shock zone. Because of the relatively greater mass of the liquid silicon droplets relative to the gaseous sodium chloride, the sikicon droplets pass through the shock zone into the post shock zone immediately above the separation plate where they impact on the plate and coalesce with silicon on the plate. In such an apparatus it would expected that the high velocity of the jet stream would carry the fine silicon droplets along and prevent any material amount of separation in velocities between the sodium chloride gas and the silicon droplets until they enter the shock zone where there is a very sudden and abrupt reduction in velocity caused by the formation of the shock wave; the relatively heavy silicon particles cannot adjust to this sudden change in velocity and strike against the flat separator where they adhere and are collected by maintaining the flat surface at approximately the melting point of silicon. It should be understood that this is a theory and other explanations for the unexpected efficient separation could be devised.

BRIEF DESCRIPTION OF THE DRAWINGS

FIG. 6 illustrates the jet impaction process in which the liquid silicon is separated from the salt vapor and other impurities.

FIG. 7 illustrates an embodiment of the invention in which the reactor nozzle is horizontally disposed so that the liquid silicon after collection flows downwardly under the influence of gravity and the vaporized salt and impurities are swept away by a counter-current stream of gas.

FIG. 8 illustrates a flat collection plate suitable for use with the embodiment of FIG. 6.

DETAILED DESCRIPTION OF THE PREFERRED EMBODIMENT

Figure 2:
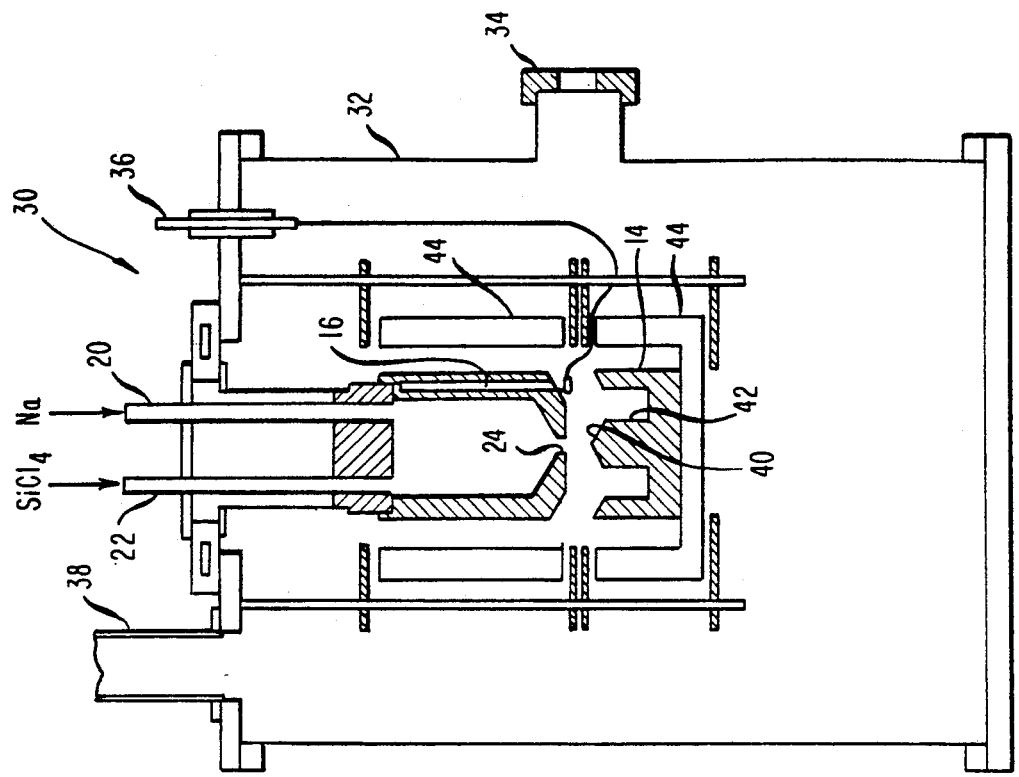
FIG. 2 illustrates an apparatus in which the collector includes a stationary impact surface near the reaction exhaust.

In accordance with the present invention purified silicon is prepared by vaporizing a silicon halide such as silicon tetrachloride and an appropriate reducing metal such as sodium, and mixing the two vaporous materials in a reaction chamber to form the reaction products of the gaseous alkali metal salt and liquid silicon. It should be understood that the term liquid silicon in this specification and claims is intended to include a structure which is a combination of semi solid and liquid. Silicon tetrachloride and sodium are believed to be the most economical materials suitable for use in this invention. Silicon tetrachloride and sodium are vaporized at about one atmosphere, at temperatures of 60° C. and 900° C. respectively. The vaporization of the reactants provides an opportunity to keep the reaction temperature well above the dew point of the salt by-product and provides for some purification of the reactants. The vapors of the reactants are mixed in the reactor means or reaction chamber which operates preferably at a wall temperature ranging from about 1400° C. to about 1600° C., a reaction temperature ranging from about 1800° C. to 2100° C., and an ambient pressure of from about 0.1 to about 0.5 atmospheres. In a particular embodiment, the reactor walls may be operated at a temperature of 1500° C., with a reaction temperature of 2200° C., and a pressure of 0.25 atmospheres.

The reaction that occurs between the silicon halide and the alkali metal is extremely rapid and exothermic. The reaction between silicon tetrachloride and sodium in the vapor state proceeds as follows.

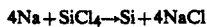

$$4Na + SiCl_4 \rightarrow Si + 4NaCl$$

This reaction exhibits heats of reaction at 298K and 1800K which are $\Delta H\ 298K = -235$ Kcal $mol^{-1}$ and $\Delta H\ 1800K = -110$ Kcal $mol^{-1}$, respectively. The adiabatic equilibrium flame temperature, depending on pressure, lies in the range 1900°–2200° C., but the intense thermal emission from the silicon droplet fume in the actual system probably quickly drops the temperature, it is most difficult to actually measure the reaction temperature. The preferred operating range of the reactor facilitates the separation of the reaction products, as the sodium chloride and other impurity chlorides such as boron chloride and phosphorus chloride remain in the vaporized or gaseous state, while the silicon exists as a liquid. If the reaction took place in a cool reactor the sodium chloride would condense, and silicon and sodium chloride would then rapidly freeze so that the resulting product would be very fine brown powder made up of 90% by weight salt particles and 10% by weight submicron sized silicon particles which has little value.

After the reaction products are formed in the reactor means, the liquid silicon in a droplet fume mixed with sodium chloride vapor is caused to exhaust from the reactor means through the orifice of a nozzle means into a vacuum chamber or separation zone maintained at a pressure less than one half that of the pressure of the reactor means, so that the stream forms a supersonic jet as it exits from the reaction chamber and strikes the flat separator. The supersonic jet of liquid silicon attains a speed of approximately $5 \times 10^2$ m $sec^{-1}$ or greater (Mach Number greater than 1.0), depending upon the shape of the nozzle means, and impinges upon the flat surface, where the silicon droplets are collected by impaction. While a supersonic jet is preferred it may be possible for the process to function effectively in the subsonic range just below the supersonic and therefore the term "supersonic" is meant to include also the marginal subsonic range. The reduced pressure in the separation zone compared to the pressure in the reactor causes the formation of the supersonic jet, and may, in one embodiment, range in pressure, from 0.001 to 0.1 atmosphere. In a preferred embodiment, the ambient pressure in this separation region was 0.02 atmosphere. As will be described in greater detail hereinafter, the supersonic jet of liquid silicon droplets impinged upon a flat separator means located approximately 4 cm from the nozzle exit. The jet has, assuming chemical equilibrium, a temperature of about 1400° C., at which temperature, the silicon droplets and sodium chloride vapor attain a velocity of about $1.0 \times 10^3$ m $s^{-1}$. Just before reaching the separation plate, however, the jet passes through a strong shock zone after which, the gas pressure and gas temperature behind the shock approaches that in the reactor. The gaseous sodium chloride thus experiences a rapid temperature rise. The silicon droplets which have a relatively (to the gas) high specific heat are in this zone for only a very short time and probably do not have time to adjust to the gas temperature; they would remain at close to their temperature in the jet.

It is preferable that the separator plate be heated to a surface temperature of from about 1300° C. to about 1500° C., and particularly high recoveries have been obtained with a temperature range of about 1390° to about 1400° C. The temperature at the collecting silicon surface may exceed these temperatures which were measured by thermocouples or by radiation in the block of graphite supporting the collector plate, because of the high temperatures of the droplets striking the surface. This would explain why the measured temperatures are less than the melting point of silicon, estimated at 1410° C. The foregoing conditions cause a rapidly growing deposit of silicon to develop, fed by the impacting silicon droplets from the jet. In the preferred embodiment the impact plate is approximately four centimeters in diameter. In the preferred arrangement the plate has an orifice in the middle which allows the silicon to flow downward and away from the gaseous stream. In order for the silicon to discharge in a collecting device maintained at atmospheric pressure, the weight of the silicon liquid can be used to maintain a pressure seal. The collection means may comprise a low sided crucible or dish, or a planar surface of any other vessel of suitable geometry to sustain a shock wave above its surface. In this specification and claims such a surface is referred to as a substantially flat, unconfined separator.

In the instance where a collector means or collector surface is maintained apart from the flat separator if the separator plate is maintained at a temperature of about 1410° C., a deposit of liquid silicon continually flows with assistance from gravity from the impaction area on the separation plate and deposits on the collection means. Since the molten silicon product is held at lower pressures and it flushed with chlorine-containing by-product gases which tend to volatilize most contaminants, it is believed that further purification occurs here. The sodium chloride, which remains a gas throughout the jet expansion and silicon collection steps is diverted by the plate and may in one embodiment, be permitted to condense on the walls of the water-cooled vacuum envelope that surrounds the process vessel. The reaction chamber, vacuum chamber and separation plate are preferably formed of graphite to withstand the high temperature.

Figure 4:
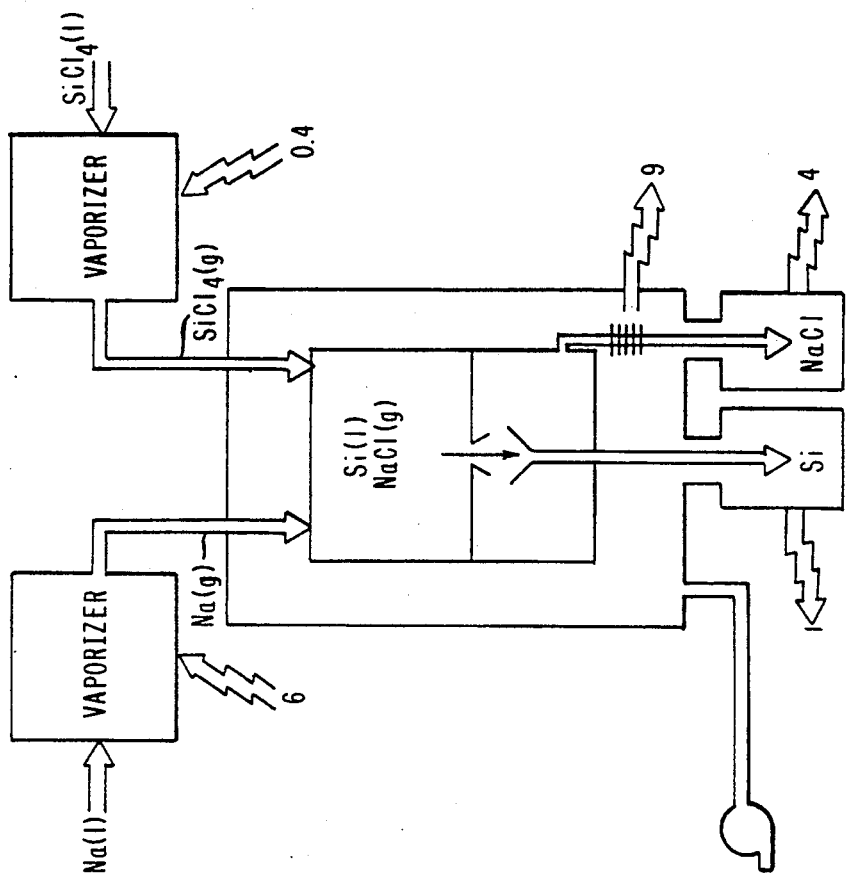
FIG. 4 is a schematic representation of the energy balances of the process.
Figure 3:
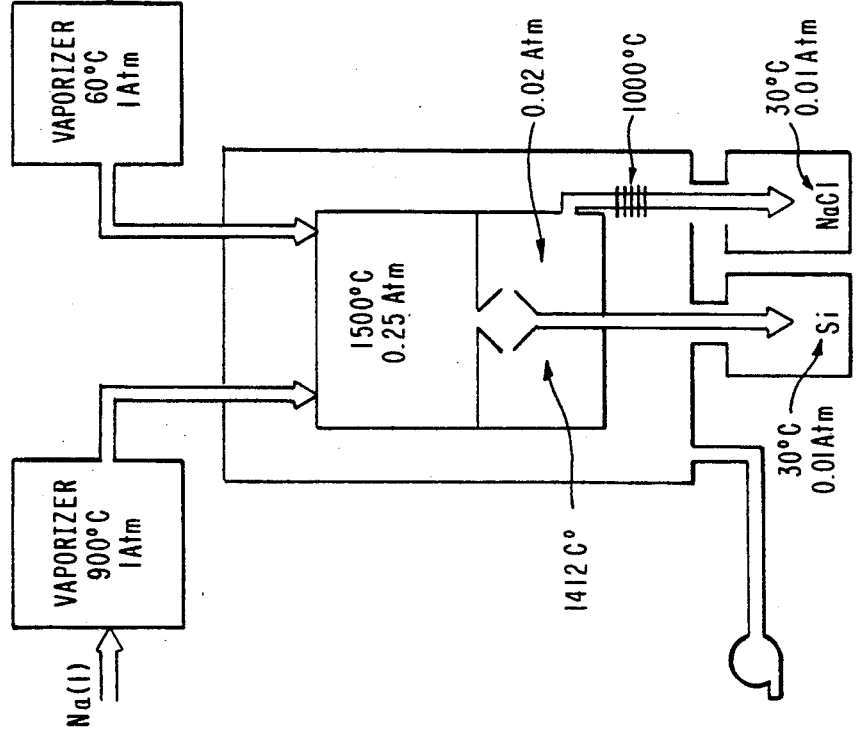
FIG. 3 is a schematic illustration of the set of preferred operating conditions of the invention.
Figure 5:
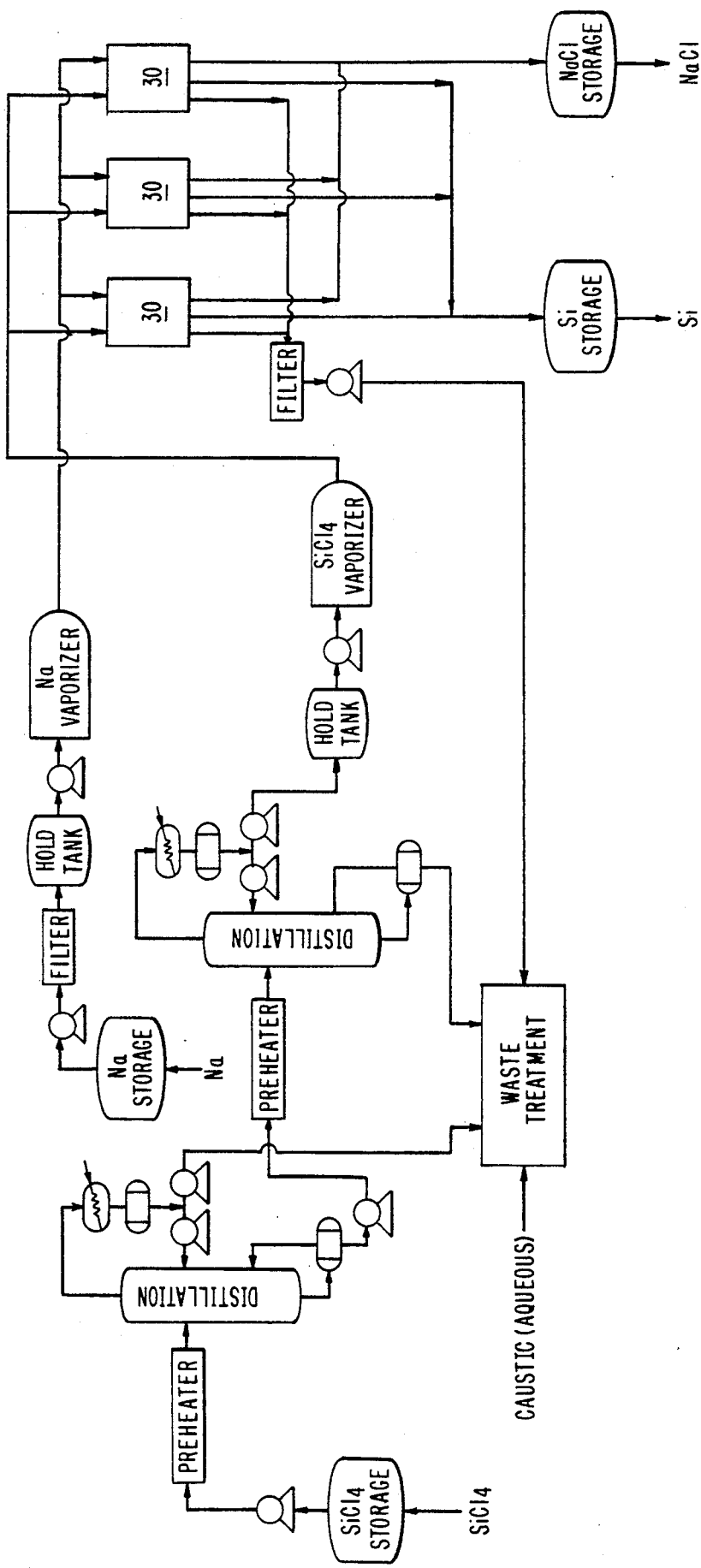
FIG. 5 is a flow diagram of the process according to one embodiment of the invention.

FIGS. 3 and 4 further illustrate and describe, in graphical form, a nominal set of operating parameters of the process of the present invention. FIG. 5 is a flow diagram of the process. The nominal parameters of the jet impaction described above, are also illustrated in FIG. 6.

Figure 1:
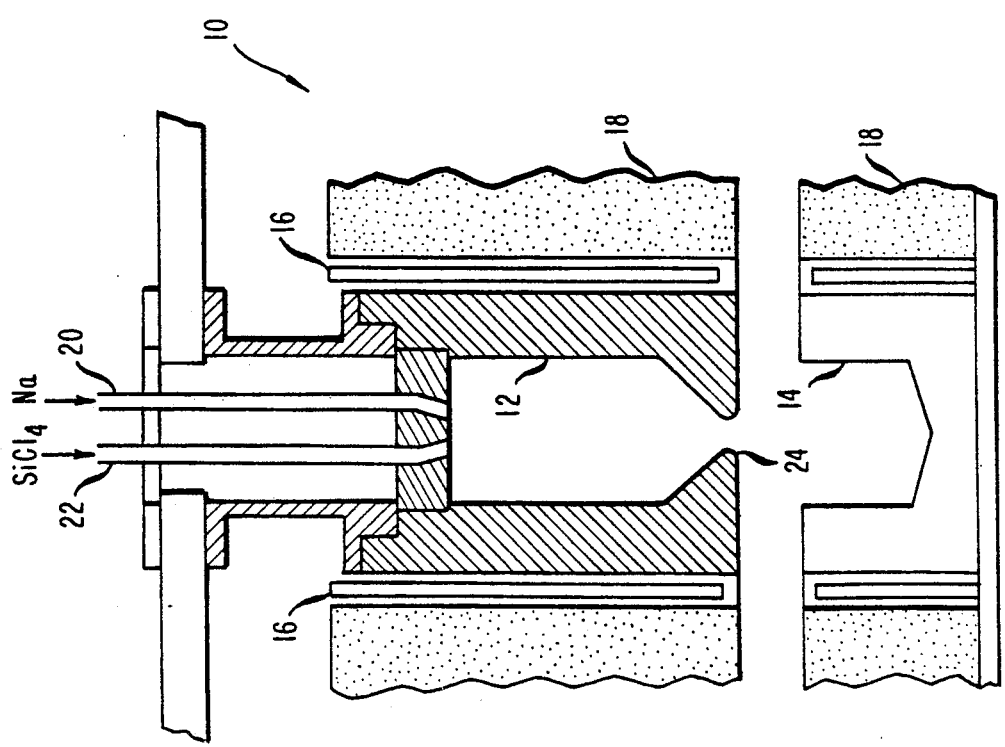
FIG. 1 illustrates a prior art process in which it was attempted—unsuccessfully—to collect silicon in a simple hollow crucible.

The apparatus shown in FIG. 1, is an early, unsuccessful model made by the applicants. The reason for its failure is not fully understood by the applicants, since it was expected to obtain good separation. However, the sides of the crucible collector are believed to interfere with the shock wave. In this apparatus vaporous sodium is fed into the reaction chamber of reactor 12 through inlet tube 20. Similar, vaporous silicon tetrachloride is introduced into the reaction chamber through tube 22. Reactor 12 is constructed from graphite to withstand the high temperatures of operation. Pre-heaters 16 are energized to prevent an initial build-up of products in a cold reactor. The product of the reaction, namely, liquid silicon droplets, and the vaporous salt exit through nozzle 24. The liquid silicon was expected to be collected in crucible 14 and the gaseous salt drawn off and condensed. Insulation 18 is provided to contain the heat of the exothermic reaction. It is now theorized that a shock layer could not be formed in the configuration used and unacceptable recovery resulted. This was probably due to the sides of the crucible, interfering with the shock layer formation. However, since the shock layer is not visible during running of the process, its absence cannot be noted.

An apparatus in accordance with the invention which did work satisfactorily is illustrated in FIG. 2 where a flat separate surface 40 is placed near but separated from nozzle 24 by a pre-determined distance so that the jet of liquid silicon droplets may impinge upon it. As indicated the silicon is separated from the salt by passing through a shock wave which is believed to slow the flow of the gaseous salt in relation to the silicon and converts the silicon particles in the gas to a liquid and deposits them on the flat separator or impact plate 40. The plate is preferably made of graphite to withstand the high temperature.

In the embodiment of FIG. 2, separator surface 40 is located on a pedestal 42 placed in the center of a silicon collector crucible 14. Experiments with this separator/collector combination demonstrated that high separation efficiencies (i.e. ratio of silicon separated and collected to silicon fed to in the reactor) of greater than 80% could be realized and the 90is possible. By contrast, as indicated the crucible approach illustrated in FIG. 1 showed separation efficiencies of less than 50%.

The embodiment of FIG. 2 is housed within a process vessel 32 having a viewing port 24 therein. Power to the preheat element 16 is applied through contact 36. A pump, not shown in the figure but shown in other figures is connected to outlet pipe 38 and serves to draw off non-condensible gases such as small amounts of unreacted silicon tetrachloride or argon used to direct flows or sweep viewing ports clean. A heat shield 44 insulates the device.

The process of the present invention utilizes the separator means or separator surface 40, maintaining it at a specific distance from the orifice of the nozzle means. Preferably, the separator means 40 may be disposed a distance from the nozzle means, in order to retain the favorable effects of impaction of the supersonic jet of liquid silicon upon the surface of the separator means. For example, the orifice diameter of the nozzle means may range from about 0.1 to about 0.3 centimeters, while the distance between the nozzle means and the separator means may range from about 1.0 to 7.0 centimeters. Preferably the orifice diameter of the nozzle may be 0.2 centimeters, and the distance between the nozzle means and the separator means may be 4.0 centimeters. Naturally, the foregoing dimensions are presented for purposes of illustration and not limitation, as a variety of orifice diameters and distances between the nozzle means and the separator means may be chosen within the scope of the present invention. The critical part of the procedure being the force at which the stream approaches the separator means and the temperature of the separator means.

FIG. 6 illustrates the basic features of the exiting jet 120 as it impinges on a silicon target 128. In this embodiment the separator 128 is a flat circular plate about two centimeters in diameter. The jet 120 in the preshock zone 122 includes sodium chloride and other chloride impurities in the gaseous state and silicon in the liquid state. As the jet approaches plate 128 it forms a shock wave 124 and passes into post shock zone 126. The silicon in post shock zone 126 is in the form of liquid droplets and is carried by its forward momentum onto separator 128 whereon it is deposited. The gaseous sodium chloride and other chloride impurities are carried away as a gas 130 and subsequently collected or disposed of as a by-product. The liquid silicon flows from the surface of the plate to a collector 60 through circular conduit 129.

As discussed earlier, the separator means may be disposed apart from the collector means, as illustrated in FIG. 2, or may operate in combination therewith. Likewise, the present apparatus may be constructed for operation in either the vertical or horizontal plane. An apparatus illustrating vertical operation of the present invention has been shown in FIG. 2. Horizontal operation of the invention is illustrated by the apparatus 50 of FIG. 7. Referring now to FIG. 7, reactor nozzle 24 is disposed in the horizontal plane so that the supersonic stream of liquid silicon impinges upon a separation means comprising a tilted or vertical plate 52. As shown in FIG. 8, plate 52 is flat. Other shapes could be utilized, as long as the shape does not interfere with the shock zone.

In the operation of the apparatus generally indicated at 50 in the horizontal plane, the liquid silicon flows downward under the force of gravity into a silicon collector means, such as collector 60 illustrated in FIG. 7.

The employment of an apparatus 50 disposed in the horizontal plane confers certain advantages upon the present invention.

(i) Sodium which inadvertently condenses in the sodium delivery line will not easily drop into the reactor causing a large pressure burst as the drops evaporate and react, (ii) Any small amounts of silicon which collect in the reactor and become impure due to long residence times will not as readily fall or be forced into the collected silicon but can be made to collect in a sump in the reactor 12;

(iii) The silicon flows downwardly as a thin liquid film while the salt vapor flows upwardly away from the silicon, sweeping impurities with it.

Further purification can be achieved by having a small sweeper flow of inert gas 62, such as argon or a reactive gas, such as chlorine pass over the silicon film below the point at which the jet strikes the separator surface. The gas helps to rapidly dilute and sweep away impurity vapors evaporating from the silicon film. Additional advantages can be made of this small sweeper flow if a small amount of chlorine or fluorine is added; this would react with metal impurities on the surface producing the halogen compounds which are gaseous and thus voltalize any of the common impurities typically found in silicon (e.g. As, Al, B, P, transition elements).

Figure 9:
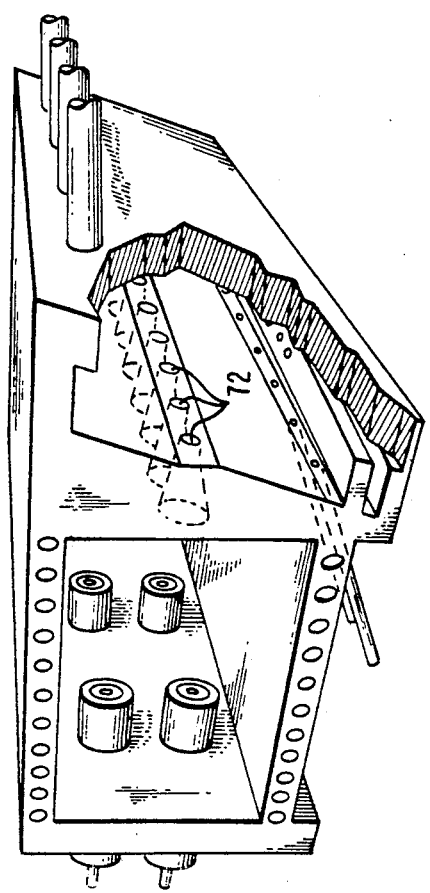
FIG. 9 illustrates an embodiment of the invention in which multiple nozzles are employed.

The present process has been described utilizing a reactor defining a single nozzle. As noted earlier, in the instance where the nozzle means has an orifice diameter of 0.7 centimeters, silicon flow rates of 0.5 kilogram per hour can be achieved. It has been found that optimal nozzle orifice size contributes to the efficiency of the separation of sodium products. Larger orifices have been found to be undesirable as a way of increasing the rate of production of the silicon product. Thus a further embodiment 70 of the present invention comprises the provisions of a plurality of nozzle means on a reactor means of sufficient size, so that larger, commercial-scale production of the purified silicon product is possible. Referring now to FIG. 9, a plurality of nozzle means 72 are provided which may impinge upon a plurality of correspondingly disposed separator means. In this way, larger quantities of purified silicon per unit time may be produced. Alternatively a greater volume of production can be achieved by using a nozzle or a plurality of nozzles having a slot-like shape. The embodiment of FIG. 12 which will be discussed later includes a slot-like orifice having a long and a short dimension.

The process of the present invention can be utilized to prepare silicon in a variety of forms. Thus, the silicon may be prepared in the forms of an ingot, single crystals, a poly crystalline sheet, and the like. In order to produce silicon in ingot form with a vertically disposed apparatus 80 such as that illustrated in FIG. 10 the crucible collector 14 and pedestal separator 42 of FIG. 2 would be replaced by a shallow funnel-shaped separator 84. The exit tube of the funnel 84 would allow silicon to flow or drop under the influence of gravity into a collector in which the silicon liquid would accumulate. The silicon would be allowed to solidify once full. Provision for removing the charged mold and inserting an empty replacement via a gate-valve air lock would allow continuous operation. The efficiency of the funnel-shaped separator embodiment can be increased by placing a fixed separator surface above the funnel to provide a non-moving separator target.

Ingot formation can also be achieved by use of the apparatus illustrated in FIG. 7. According to that embodiment, the downwardly flowing silicon is collected in heated mold 60. The form of the heated mold 60 dictates the exact dimensions of the ingot formed.

Figure 10:
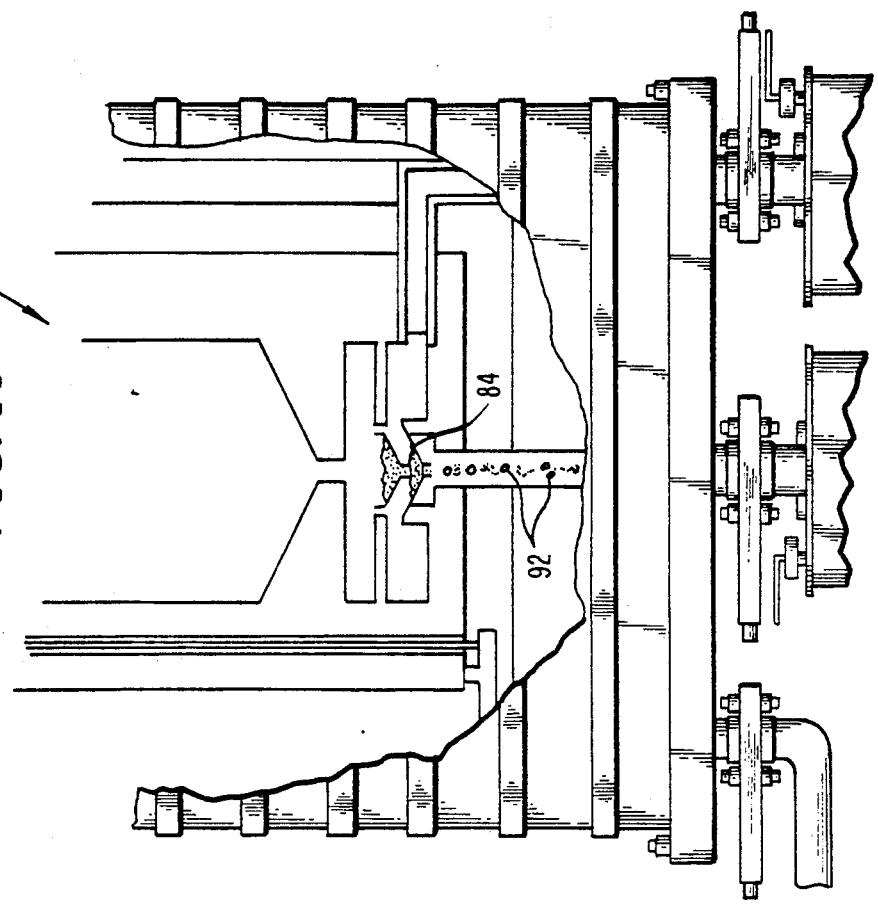
FIG. 10 illustrates an embodiment of the invention in which the silicon collector has a funnel-like shape so that the silicon assumes a pellet-like form.

A convenient product form for continuous Czochrolski processes is a pellet form of poly crystalline silicon. Pellets 92 can be produced by using the vertical configuration of FIG. 10 with a funnel-shaped separator 84 similar to the funnel-shaped separator 84 previously described. An acceptable form of the separator is illustrated in FIG. 10. The exit tube from the funnel 84 would preferably have a diameter of 1 mm or less so that droplets with a mass of 0.5 gms or less would drop from the end of the funnel (estimated from surface tension). These droplets would be allowed to solidify either by splat cooling or in a large cooled silicon collector or solidified during their fall through a shot tower.

In the horizontal configuration of FIG. 7 the silicon would drop from the low end of the separator plate 52. Droplet size could be minimized by placing fine quartz or graphite fibers at the end of the separator from which the silicon would drop.

Figure 11:
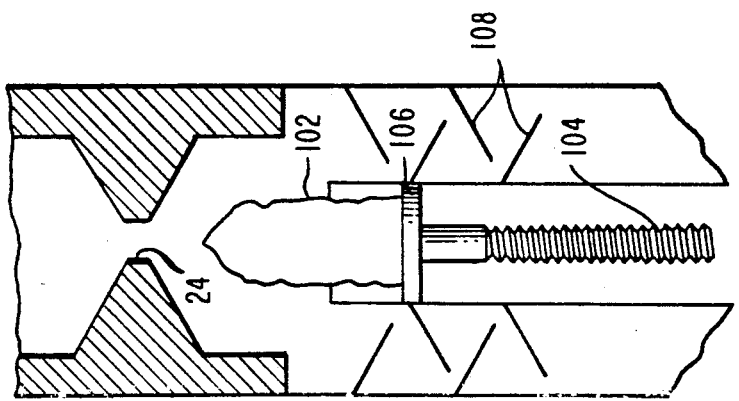
FIG. 11 illustrates a technique for the preparation of a single crystal silicon boule.

The use of flames of sodium and silicon tetrachloride to produce single crystal rods or boules can be done using the apparatus 100 illustrated in FIG. 11. In the embodiment, a vertical configuration apparatus such as described in FIG. 2 is used in which the separator itself is a growing single crystal 102 of the silicon. The single crystal 102 is withdrawn as it grows so that the separation surface onto which the silicon is deposited, in this case the top of the growing crystal, is kept at a constant distance from the reactor exit orifice 24. Careful temperature control is needed to maintain the top of the silicon crystal rods at the melting point. The temperature control can be obtained by careful control of the reactor wall temperature; addition of excess silicon tetrachloride to the reactor; addition of an inert gas, such as argon to the reactor; feeding a portion of one of the reactants, e.g. sodium, to the reactor in the liquid phase, and radiant heating of the rod from the electrical heaters 16 placed around the reactor 12 and crucible 14. The process is similar in some respects to the Vernueil flame process for producing single crystals of metal oxides such as ruby. The boule sits upon a pedestal 106 which moves downwardly under the influence of threaded rod 104. A prime mover, typically a conventional motor, now shown, is used to drive rod 104. A plurality of salt condensation plates 108 help to take the salt out of the vapor phase to the liquid phase for collection.

a sheet form of silicon product 112 is desirable for use in fabricating photovoltaic cells. A relatively uncomplicated technique to product such sheets 112 from a sodium/silicon tetrachloride flame is illustrated as apparatus 110 in FIG. 12. According to this embodiment the separator would comprise a moving sheet 114 of a suitable substrate material (e.g. mullite, graphite). A thin layer of silicon 112 would be sprayed upon the substrate sheet 114. The thickness of the silicon sheet 112 is controlled by the rate of speed at which the substrate sheet 114 passes through the the 116, the rate of silicon production and the separation efficiency.

There are many advantages to the apparatus that are not found in other prior art methods. Specifically, high rates of production are possible and contamination of the silicon is ionized by the lack of silicon reservoirs and/or dies otherwise normally required. Also the rapid deposition of the silicon implies that the cooling rates of the deposited silicon can be rapid, thus preventing contamination of the silicon by the substrate material. For this process, rates of sheet formation can be expected to be in the order of meters per hour as opposed to centimeters per hour for other sheet processes.

Figure 12:
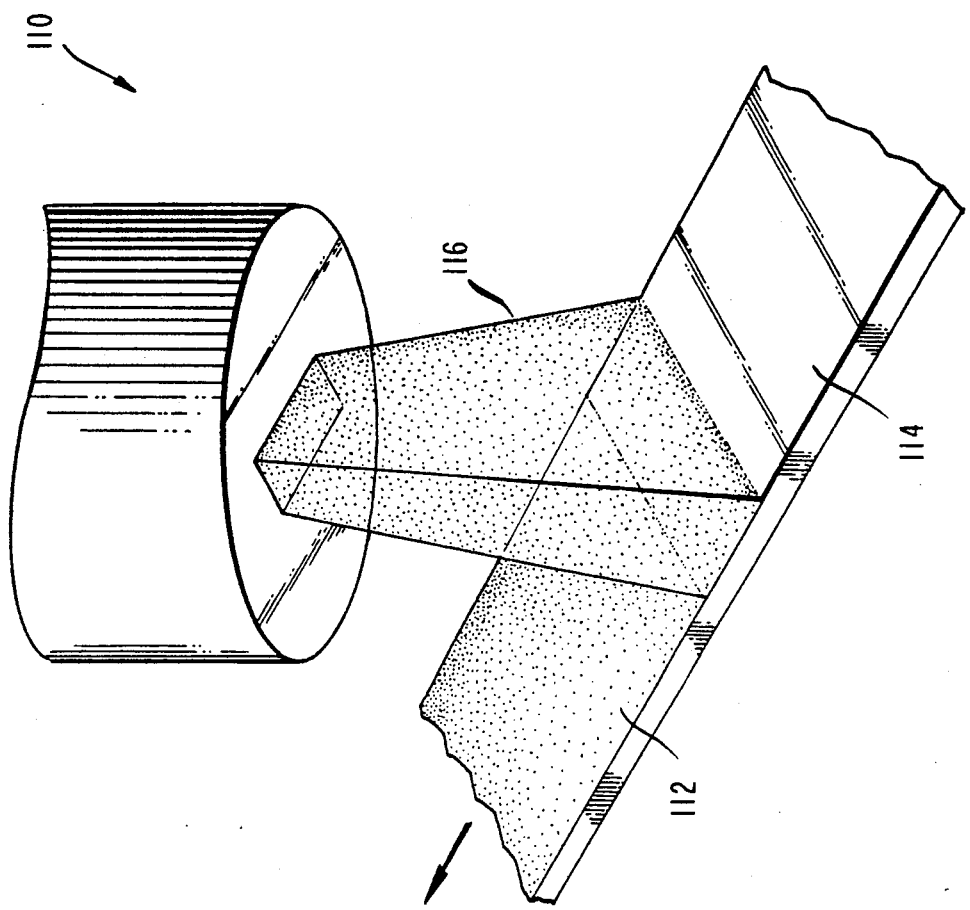
FIG. 12 illustrates a technique for preparing silicon sheet.

The embodiment of FIG. 12 lends itself to the continuous manufacture of solid state devices such as diodes, transistors and solar cells. Doping of the silicon can be continuously controlled during manufacture.

The nozzles have been described or illustrated as being circular or slot like. They may also be used individually or in groups as required by the volume demands of the system. It is further likely that other geometric shapes may be satisfactory too and it should be understood that the basic teaching of the present is not necessarily limited to any specific shape.

The preferred speed of the jet is in the supersonic range as previously described. However, it is possible that the desired effect may also be achieved with a jet just on the edge of the supersonic range (i.e. in the subsonic range). The term "supersonic" as employed in this disclosure is therefore intended to include in the supersonic or near supersonic range.

the preferred phase for the reactants is gaseous to maintain the required reaction temperature as previously described. However, it is possible to use either reactant in the liquid phase or a portion of one reactant in the liquid phase so long as the required reaction temperature is maintained.

While the invention has been described with reference to its preferred embodiment thereof it will be appreciated by those of ordinary skill in the art that various changes can be made in the process and apparatus without departing from the basic spirit and scope of the invention.

What is claimed is:

1. An apparatus for producing high purity metal, which comprises:

a vessel including a reactor, a product separation chamber and a by-product separation chamber, said reactor positioned within said vessel comprising a reaction chamber and a reaction products outlet nozzle;

reactant conduit means for introducing vaporized reactants into said reaction chamber of said reactor to effect reaction thereof to form reaction products including droplets of said high purity metal;

conduit means including said reaction products outlet nozzle connecting said reactor to said product separation chamber and a conduit connecting said separation chamber to said by-product separation chamber of said vessel;

vacuum means connected to said vessel to effect a pressure differential between said reaction chamber and said product separation chamber to form a product stream at supersonic velocity of said reaction products exiting outlet nozzle of said reactor and entering said product separation chamber;

a product separator plate in said product separation chamber having a surface positioned within said product separation chamber of said vessel proximate to said reaction products outlet nozzle said surface of said separator plate disposed towards said reaction products outlet nozzle at a distance within which a shock wave zone forms from said supersonic product stream to cause said droplets of sail metal to impinge on said surface of said separator plate, said separation having side walls of a height (L) defined by:

$$L < \frac{W - D_E - 2(d/F)}{2(0.35 + (1/F))}$$

wherein W is the width of said separation chamber, d is the distance from said reaction products outlet nozzle to said separator plate surface, $E_E$ is the expandable supersonic jet diameter immediately after the outlet orifice, and wherein:

$$D_E = \frac{D_N}{M^{\frac{1}{4}}} \left(\frac{2}{\gamma + 1}\right)^{\frac{\gamma+1}{4(\gamma-1)}} \left(\frac{P_T}{P_0}\right)^{\frac{\gamma+1}{4\gamma}}$$

wherein $D_N$ is the diameter of the outlet orifice, $P_T$ is the pressure in said reaction chamber, $P_O$ is the pressure in the separation chamber, $P_T/P_O$ is the nozzle pressure ratio, $\gamma$ is the ratio of specific heats at constant pressure to specific beats at constant volume of gases exiting said reaction products nozzle and M is the Mach number, and wherein:

$$M = \left(\frac{2}{\gamma - 1}\left[\left(\frac{P_T}{P_0}\right)^{\frac{\gamma-1}{\gamma}} - 1\right]\right)^{\frac{1}{2}}$$

with $F = 0.22 + 5.22M^{0.9}$; and means for collecting said droplets of said metal.

2. The apparatus of claim 1 wherein said reaction products outlet nozzle is substantially horizontally positioned with respect to gravity.

3. The apparatus as defined in claim 1 wherein said reactor is provided with a plurality of reaction products outlet nozzles.

4. The apparatus as defined in claim 1 wherein said means for collecting said droplets of said metal comprises a collector and further includes a piston for maintaining a fixed liquid level as liquid cools to for a solid product.

5. The apparatus as defined in claim 1 and further including a movable platform for said means for collecting said droplets of said high purity metal, said movable platform receding away from said reaction products outlet nozzle in response to collection of said high purity metal.

6. The apparatus as defined in claim 1 wherein said means for collecting said droplets of said high purity metal includes a substrate for depositing as a film said high purity metal.

7. The apparatus as defined in claim 1 and further including means for maintaining said separator plate at about the melting temperature of said high purity metal.

8. The apparatus as defined in claim 1 wherein said reaction products outlet nozzle has an exit cross section longer in one direction than in an other thereby producing a ribbon jet of product and by-product.

9. The apparatus as defined in claim 7 wherein said one dimension of said nozzle is from 0.3 to 1.4 cm. and said other dimension is from 1 to 50 cm.

10. The apparatus as defined in claim 1 wherein said reaction products outlet nozzle has an effective diameter in the range of 0.3 to 1.4 centimeters.

11. The apparatus as defined in claim 10 wherein said reaction products nozzle is of a diameter of substantially 0.7 centimeters.

12. The apparatus as defined in claim 1 wherein said distance between said reaction products outlet nozzle and said surface of said separator plate is in the range of from 1.0 to 10.0 centimeters.

13. The apparatus as defined in claim 12 wherein said distance is substantially 3.5 centimeters.

14. The apparatus as defined in claim 1 wherein said surface of said separator plate is essentially flat.

15. The apparatus as defined in claim 14 wherein said surface is inclined with respect to said reaction products outlet nozzle.

* * * * *